United States Patent [19]

Hayashi et al.

[11] Patent Number: 5,214,002

[45] Date of Patent: May 25, 1993

[54] PROCESS FOR DEPOSITING A THERMAL CVD FILM OF SI OR GE USING A HYDROGEN POST-TREATMENT STEP AND AN OPTIONAL HYDROGEN PRE-TREATMENT STEP

[75] Inventors: Yutaka Hayashi; Mitsuyuki Yamanaka, both of Ibaraki, Japan

[73] Assignee: Agency of Industrial Science and Technology, Tokyo, Japan

[21] Appl. No.: 800,711

[22] Filed: Dec. 3, 1991

Related U.S. Application Data

[63] Continuation of Ser. No. 575,625, Aug. 31, 1990, abandoned.

[30] Foreign Application Priority Data

Oct. 25, 1989 [JP] Japan .................................. 1-277938

[51] Int. Cl.$^5$ ........................................ H01L 21/205
[52] U.S. Cl. ........................ 437/234; 136/258; 156/612; 156/613; 156/614; 427/255.1; 437/937
[58] Field of Search .............. 136/258; 118/720, 733; 156/610, 611, 612, 613, 614; 427/38, 39, 255.1; 148/DIG. 1, DIG. 64, DIG. 110, DIG. 169; 437/233, 101, 937, 234

[56] References Cited

U.S. PATENT DOCUMENTS

| 4,331,486 | 5/1982 | Chenevas-Paule et al. | 437/937 |
|---|---|---|---|
| 4,634,605 | 1/1987 | Wisemann | 136/258 |
| 4,683,147 | 7/1987 | Eguchi et al. | 437/233 |
| 4,859,617 | 8/1984 | Nomoto et al. | 437/40 |
| 4,908,330 | 3/1990 | Arai et al. | 437/170 |
| 4,914,052 | 4/1990 | Kanai | 437/81 |
| 4,957,772 | 9/1990 | Saitoh et al. | 427/39 |
| 4,971,832 | 11/1990 | Arai et al. | 427/39 |

FOREIGN PATENT DOCUMENTS

| 0175223 | 3/1986 | European Pat. Off. | 148/DIG. 1 |
|---|---|---|---|
| 0045224 | 8/1980 | Japan | 437/937 |
| 0107825 | 6/1985 | Japan | 148/DIG. 1 |
| 0153277 | 7/1986 | Japan | 437/937 |
| 0131512 | 11/1986 | Japan | 148/DIG. 1 |
| 0081310 | 9/1987 | Japan | 148/DIG. 1 |
| 0152619 | 9/1987 | Japan | 437/937 |
| 0014568 | 7/1988 | Japan | 437/937 |

OTHER PUBLICATIONS

Del Valle et al., 14th IEEE Pholovoltaic Specialists Conf., Jan. 7-10, 1980, pp. 202-207.
Apole et al., Solar Energy Materials 17 (1988) pp. 391-405.
"Hydrogenation of Low-Pressure Chemical-Vapor Deposition Silicon Thin Films", by Zhang, P. X. et al., Phys. Review B, vol. 36, No. 17, 1987 pp. 9168-9170.
"Preparation Of Amorphous Silicon Films by Chemical Vapor Deposition From Higher Silanes $Si_nH_{2n+2}$ (n>1)", by Gau, S. C. et al., Appl. Phys. Lett. 39(5), Sep. 1, 1981, pp. 436-438.
"Low Defect Density Amorphous Hydrogenated Silicon Prepared By Homogeneous Chemical Vapor Deposition", By Scott et al., Appl. Phys. Lett. 40(11), Jun. 1, 1982, pp. 973-975.
"Hydrogenated Amorphous Silicon Films Deposited In A Helium Atmosphere", By Chu et al., Appl. Phys. 60(12), Dec. 15, 1986, pp. 4268-4272.
"Hydrogenation Of Evaporated Amorphous Silicon Films By Plasma Treatment", by Kaplan et al., Appl. Phys. Lett. 33(5), Sep. 1, 1978, pp. 440-442.
Pankove et al., "Hydrogen and Dehydrogenation Of Amorphous And Crystalline Silicon", *Appl. Phys. Lett.*, vol. 32, No. 7, Apr. 1, 1978, pp. 439-441.

Primary Examiner—Olik Chaudhuri
Assistant Examiner—Ken Horton
Attorney, Agent, or Firm—Spencer, Frank & Schneider

[57] ABSTRACT

A process for depositing a thin semiconductor film includes the steps of depositing a thin film on a substrate by feeding onto the surface of the substrate being heated a gaseous starting material containing a constituent element of the thin film, and feeding excited hydrogen to the thin film without exposing the thin film to the ambient air. Disilane was fed together with hydrogen carrier gas onto a quartz substrate to deposit thereon a thin amorphous silicon film, to which excited hydrogen from a hydrogen plasma was then fed to modify the deposited thin silicon film. As a result, the photoconductivity of the thin silicon film was improved.

15 Claims, 4 Drawing Sheets

PROCESS FOR DEPOSITING A THERMAL CVD FILM OF SI OR GE USING A HYDROGEN POST-TREATMENT STEP AND AN OPTIONAL HYDROGEN PRE-TREATMENT STEP

This application is a continuation of application Ser. No. 07/575,625, filed Aug. 31, 1990, now abandoned.

BACKGROUND OF THE INVENTION

1. Field of the Invention

The present invention relates to processes for depositing thin semiconductor films, and particularly to a process for thermally depositing a thin semiconductor film excellent in photoelectric characteristics from a gaseous starting material.

2. Description of the Prior Art

As one of conventional processes for thermally depositing a thin silicon film from a gasous starting material (thermal CVD method), there is known a technology of depositing a thin amorphous, singlecrystalline or polycrystalline film from a silane gas. The lowest temperature of a substrate permitting of film formation is 500° C. when monosilane ($SiH_4$) is used as the silane gas, 425° C. when disilane ($Si_2H_6$) is used, and 400° C. when trisilane ($Si_3H_8$) is used. At such a temperature, however, the deposition rate is usually about 1,000 Å per hour. Thus, deposition in practice must be effected at a temperature at least 50° C. higher than the above-mentioned temperature. Such high-temperature deposition, or film formation, inevitably restricts the kind of substrate, in particular, a glass substrate is unusable. In addition, the photoconductivity of a film deposited by such a thermal CVD method is lower by at least two figures than a film deposited by a plasma CVD method.

On the other hand, a thermal CVD amorphous silicon film is excellent in other characteristics such as a resistance to photo-induced degradation by light. Under such circumstances, there has been a demand for a process for depositing a thin semiconductor film at a high deposition rate while making much of the merits of the thermal CVD method as well as a technology of improving the photoelectric characteristics of a film of the kind as described above. This problem has been the same also with a thin germanium film and a thin carbon-containing silicon film.

It is known that the photoelectric characteristics of a thin film can be improved by bonding hydrogen atoms to defects such as dangling bonds of silicon, germanium, carbon or like atoms. When a thin film formed by the thermal CVD method was taken out of film forming equipment into the ambient air and then exposed to a hydrogen plasma, however, no substantial improvement was recognized in the photoconductivity of the film.

SUMMARY OF THE INVENTION

Accordingly, an object of the present invention is to provide a process for producing a thin semiconductor film excellent in photoelectric characteristics by controlling the amount of hydrogen bonded to atoms of a constituent element of a deposited thin semiconductor film.

Another object of the present invention is to provide a process for producing a thin semiconductor film, by which it can be formed at a high deposition rate even when the temperature of a substrate is lower than that of the conventional high deposition rate thermal CVD.

In the first aspect of the present invention, a process for depositing a thin semiconductor film comprises the steps of depositing a thin film on a substrate by feeding to the surface of the substrate being heated a gaseous starting material containing a constituent element of the thin film; and feeding excited hydrogen onto the thin film without exposing the thin film to the ambient air.

Here, the gaseous starting material may be a silane gas and the thin film may be a thin amorphous silicon film. The gaseous starting material may be fed together with hydrogen gas as a carrier gas.

The gaseous starting material may comprise at least alkylsilane and the thin film may contain carbon.

The gaseous starting material may be a germane gas and the thin film may be a thin germanium film.

The thin film deposition step and the excited hydrogen feeding step may be alternately repeated. The thickness of a thin film deposited in each single thin film deposition step may be 300 Å or less.

The excited hydrogen may be supplied from a hydrogen plasma formed by discharge in a reaction chamber in which the substrate is placed.

Here, the excited hydrogen may be generated by plasma discharge of hydrogen.

The excited hydrogen may be generated by the radiation of ultra-violet light, X-ray or electron beam onto hydrogen.

The excited hydrogen may be generated by the mixture of excited mercury with hydrogen.

The temperature of the substrate may be 450° C. or lower.

Here, the process may further comprise an initial step of feeding excited hydrogen onto the substrate before the thin film deposition step.

In the second aspect of the present invention, a process for depositing a thin semiconductor film comprises the steps of feeding excited hydrogen onto a heated substrate; and feeding a gaseous starting material onto the heated substrate without exposing the substrate to the ambient air.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
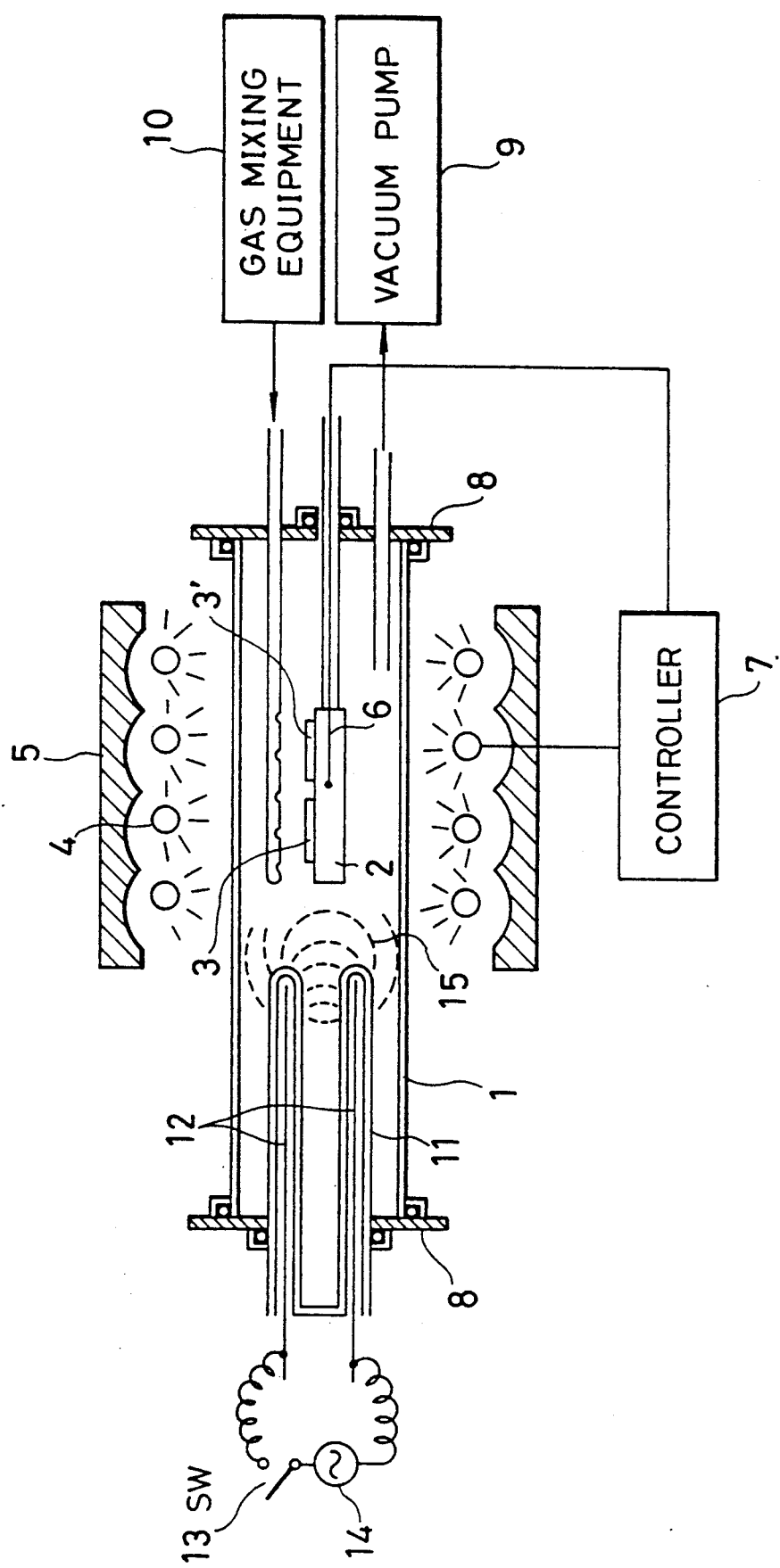
FIG. 1 is a schematic view showing equipment that may be used in the present invention.

When a thin silicon film is deposited on a substrate using a silane gas or mixed gas of silane fluoride gas and a reducing gas such as hydrogen as the gaseous starting material according to the CVD method, hydrogen either contained in the gaseous starting material is bonded to deposited silicon. When germanium is deposited, from a mixed gas of germane or germanium fluoride and a reducing gas such as hydrogen or a silane gas, or when carbon-containing silicon is deposited from a gas of a silane and a hydrocarbon or alkylsilane together with a hydrogen containing gas, hydrogen is bonded to deposited germanium or silicon and carbon as well.

According to the present invention, excited hydrogen is fed onto a deposited thin semiconductor film or a substrate to be used to deposit thereon a thin semiconductor film, whereby the amount of bonded hydrogen as described above is controlled to improve the properties of the deposited semiconductor film. Thus, a description will first be made of bonded hydrogen.

There are two kinds of bonded hydrogen atom in the deposited film, one decides the structure of the deposited film and another terminates the dangling bond of the atoms constituting the semiconductor film. The structure of the deposited thin semiconductor film varies depending on the amount of bonded hydrogen. If the film deposition temperature is set at the same level, the amount of bonded hydrogen contributory to the structure in a continuously deposited film is larger than that of an intermittently deposited film, and further in the intermittently deposited film it is increased as the thickness of a film deposited in one step is increased. In the case of deposition in the several intermittent step, it is believed that the amount of bonded hydrogen is decreased as the intervals between the deposition step are prolonged. If the deposition temperature is set at the same level in the present invention wherein excited hydrogen is used, the amount of hydrogen atoms terminating dangling bonds of the atoms constituting the semiconductor film is increased as the excited hydrogen concentration in the gaseous phase is raised. It is hydrogen atoms terminating the dangling bonds that contributes to the photoelectric characteristics of a thin semiconductor film. The amount of such hydrogen atoms is very much smaller than the amount of bonded hydrogen contributory to the structure of the deposited film. The former is usually below the lowest level (about 1%) in measurement of the amount of hydrogen by infrared absorption, and hence cannot be measured with accuracy in the most cases. Even if the amount of hydrogen contributory to the structure of the deposited film is small, however, the photoelectric characteristics of the film are improved in so far as the dangling bonds in the film are terminated by excited hydrogen. On the other hand, if the defects in the deposited film are not made up by excited hydrogen even though the amount of hydrogen contributory to the structure of the film is large, the photoelectric characteristics of the film are poor. Thus, the bonded hydrogen terminating the dangling bonds may be measured alternatively by measuring the photoelectric characteristics, for example photoconductivity. When excited hydrogen is fed during the intermittent deposition process of a film or in the duration time of the stopping period of the intermittent process, the bonded hydrogen is increased to an amount enough to be measured with infrared absorption as the thickness of the film deposited in one step is increased. In this case, it has not been cleared whether the excited hydrogen atoms interrupt Si—Si bonds to penetrate into the film so that they contribute to the structure of the deposited film or the film formation mechanism in the step following to the feeding step of the excited hydrogen is varied due to the feeding of excited hydrogen.

In the present invention, the term "controlling the amount of bonded hydrogen" is intended to include the feeding of excited hydrogen is done to bond hydrogen atoms to the defective portions of a deposited thin film, causative of deterioration of the photoelectric characteristics of the deposited thin film, even if hydrogen has already been contained in the thin film, and/or the controlling the number of bonded hydrogen atoms contributory to the structure. Since the amount of hydrogen atoms bonded to the defective portions of the thin film is extremely small as already described, it sometimes happens that the total amount of bonded hydrogen is not significantly changed even when the photoelectric characteristics of the film is improved. The term "controlling the amount of bonded hydrogen" is also intended to indicate that the amount of bonded hydrogen contributory to the structure is either increased or decreased as compared with that in a film deposited in one continuous step according to conventional thermal CVD method.

Silane gases ($SiH_4$, $Si_2H_6$, $Si_3H_8$, etc.), germane gases ($GeH_4$, $Ge_2H_6$, etc.), each of silane and germane which may have all or some of the hydrogen atoms thereof substituted with fluorine, and alkylsilane gases having an alkyl group bonded to a silicon atom [$Si_nH_m(C_xH_y)2n+2-m$] can be used as gaseous starting materials of thin Si, Ge and C-containing Si films, respectively, in the present invention. The feeding of excited hydrogen may be done by introducing hydrogen into a depressurized chamber while applying an AC voltage across two electrodes disposed inside or outside the chamber to form a hydrogen plasma, and guiding the plasma onto the surface of a thin film or the surface of a substrate. The hydrogen plasma may be formed by either inductive coupling of alternating current or introduction of microwaves from a portion of the chamber formed from an insulating material. The plasma may be formed in a space containing the substrate or a separate space. Alternatively, excited hydrogen may be formed by introducing hydrogen into a depressurized chamber and irradiating the hydrogen with electron beams or X-rays. Further alternatively, excited hydrogen may be formed by irradiating hydrogen with far ultraviolet rays or by mixing hydrogen with excited Hg gas, in which case the operating pressure may be ordinary one.

In any case, when a material liable to release impurity atoms or molecules, such as a metallic electrode, is disposed in a plasma discharge region in such a way as to be in direct contact with the plasma, the impurity atoms or molecules are, together with excited hydrogen, introduced into a film being deposited, leading to a failure in improving the properties of the film. Accordingly, any metallic members for the plasma discharge electrode must be sealed with quartz or the like as in the following Examples.

A description will now be made of a thermal CVD method using disilane ($Si_2H_6$) as one embodiment of the present invention.

FIG. 1 shows equipment as used in experiments, which is provided with a quartz chamber 1 including a susceptor 2 on which substrates 3 and 3' are placed. Infrared lamps 4 are designed to emit infrared rays with which the susceptor 2 and substrates 3 and 3' are irradiated to be heated up. Numeral 5 refers to a reflector mirror. The temperature of the substrates 3 and 3' is detected with a thermocouple 6 inserted into the susceptor 2. A signal from the thermocouple 6 is input into a controller 7, which controls the electric power fed into the infrared lamps 4 in accordance with the high or low level of the signal to eventually control the temperature of the substrates 3 and 3'. The quartz chamber 1, which is vacuum-sealed with stainless steel flanges 8, is capable of being depressurized with a vacuum pump 9. One or a plurality of predetermined kinds of gases from a gas mixing equipment 10 are fed onto the surfaces of the substrates at a controlled flow rate to deposit thin films on the respective substrates.

Discharge electrodes 12 sealed with quartz 11 are inserted into the quartz chamber 1. An AC voltage from an AC power source 14 having a switch 13 is applied across the discharge electrodes 12 to generate plasma discharge near the electrodes 12 when the chamber 1 is depressurized at or below 10 Torr.

Without exposing the resulting deposited films to the ambient air, excited hydrogen is fed onto the deposited films. The heating may be effected either by resistance heating or high-frequency inductive heating instead of the infrared heating.

EXAMPLE 1

This Example demonstrates a case where thin silicon films were deposited using disilane ($Si_2H_6$) as the gaseous starting material. Hydrogen was used as a carrier gas. As the substrates 3 and 3', a quartz substrate was used for the measurement of the photoelectric characteristics of a deposited film, and a crystalline silicon substrate was used for the measurement of the amount of bonded hydrogen. The substrates 3 and 3' were placed on the SiC-coated susceptor 2 as shown in FIG. 1. 40 sccm of $H_2$ and 12 sccm of $Si_2H_6$ were mixed and then were fed onto the substrates heated with the infrared lamps 4. The chamber 1 was depressurized to a predetermined pressure (10 Torr in this Example), while the temperature of the substrates was set at about 440° C. Thin silicon films were deposited to a predetermined thickness. Subsequently, the feeding of only $Si_2H_5$ in the mixed gas was stopped. The chamber was evacuated and the hydrogen flow rate was controlled to set the pressure in the chamber at a predetermined level (1 to 0.3 Torr in this Example). The AC power source was turned on via the switch 13 to form a hydrogen plasma 15, from which excited hydrogen was fed onto the thin silicon films. The above silicon film deposition and excited hydrogen treatment were repeated until the total thickness of the deposited film became a predetermined value. The deposited thin silicon films which went through the foregoing process were of hydrogenated amorphous silicon.

The amount of bonded hydrogen in and the photoconductivity of the resulting thin amorphous silicon films were measured. The amount of bonded hydrogen was measured based on the infrared absorption of the film in the far infrared region.

The photoconductivity of a silicon film with the thickness of 1500−3000 Å onto which no excited hydrogen had been fed was at most $10^{-8}$ S/cm under a light having an AM1.5 spectrum and an intensity of 60 mW/cm$^2$. In contrast, the photoconductivity of a silicon film with the thickness of 1500 −3000 Å formed by alternately repeating about 60 Å deposition and three minutes of feeding of excited hydrogen was at least $4 \times 10^{-6}$ S/cm. The photoconductivity of a silicon film with the thickness of 1500−3000 Å formed by alternately repeating about 200 Å deposition and five minutes of feeding of excited hydrogen under 0.3 Torr was $8 \times 10^{-6}$ S/cm.

Figure 2:
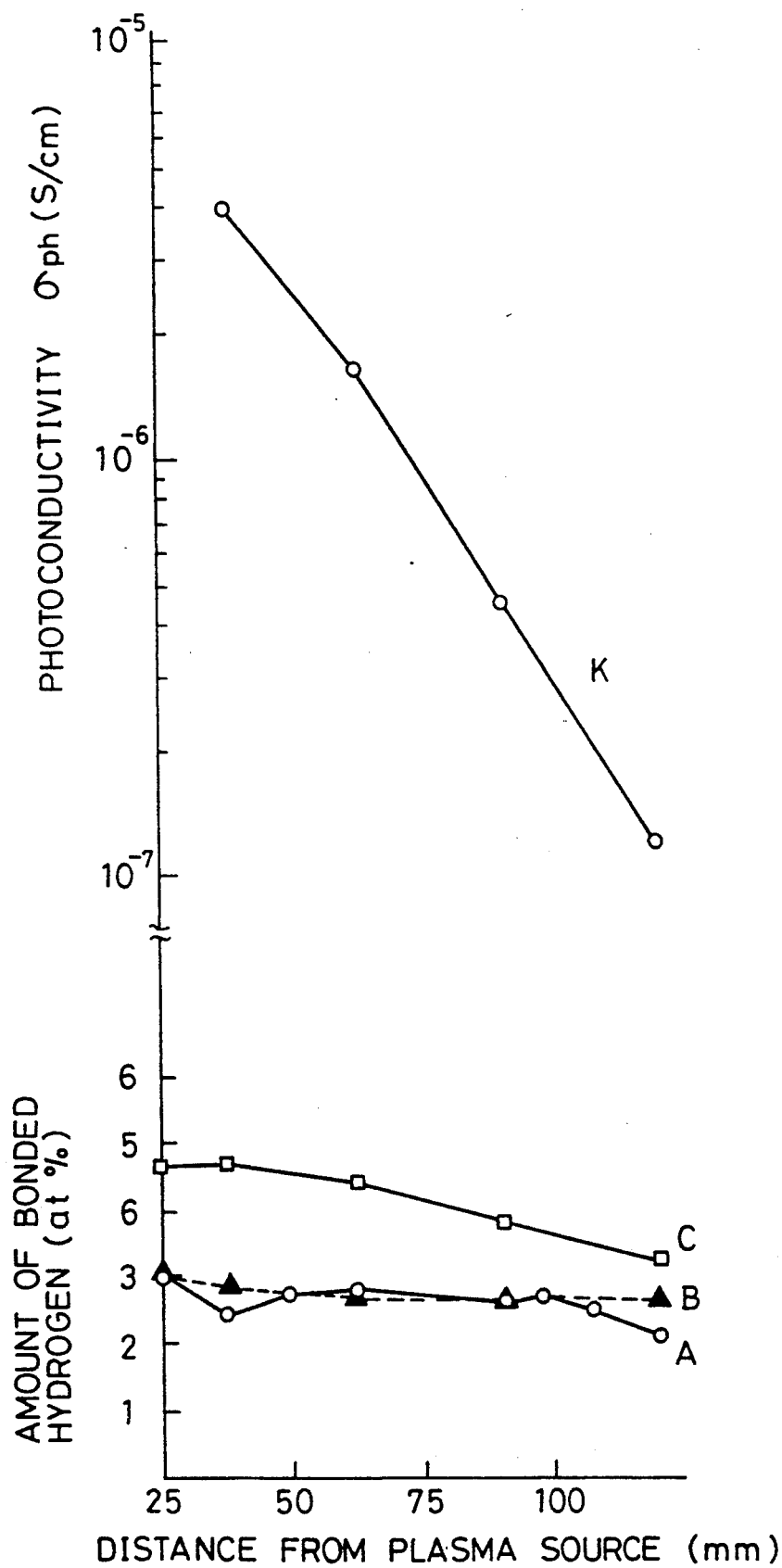
FIG. 2 is a characteristic diagram showing the relationships between the photoconductivity of and bonded hydrogen in a thin semiconductor film and the distance of the loctation, at which the deposition was done, from the plasma source.

The photoconductivity of the deposited film was increased as the location of deposition was closer to the hydrogen plasma source. FIG. 2 shows relationships between the photoconductivity of and the amount of the bonded hydrogen in the deposited film and the distance of the location, at which the film was deposited, from the plasma source. The photoconductivity $\sigma_{ph}$ of a silicon film with the thickness of 1500−3000 Å formed by alternately repeating about 200 Å deposition and 5 minutes of feeding of excited hydrogen under 0.3 Torr varies with the distance from the plasma source as shown as curve K. The photoconductivity is exponentially dependent rather than linearly dependent on the distance from the plasma source. Since the concentration of the excited hydrogen to be fed from the plasma source decreases exponentially with the distance from the plasma source, it is thought that the improving ratio of the photoconductivity of the deposited silicon film is proportional to the concentration of the excited hydrogen in the gaseous phase.

The curve A in FIG. 2 is an amount of bonded hydrogen in the silicon film formed under the same condition as of the film for measuring the photoconductivity. The curve B is an amount of the bonded hydrogen in the film formed by alternately repeating about 200 Å deposition and the stopping the feed of the starting material, during the stopping period of 5 minutes no excited hydrogen was fed. There is not significant difference between curves A and B. And in both curves, the variation of amount of the bonded hydrogen with the distance from the plasma source is within an error level of the measurement.

The curve C in FIG. 2 is an amount of the bonded hydrogen in the film formed by alternately repeating about 700 Å deposition and the excited hydrogen treatment. The amount of the bonded hydrogen of the film is larger than that of the film by repeating intermittent 200 Å thick deposition steps. And further, it is clearly shown that in curve C, the amount of the bonded hydrogen is dependent on the distance from the plasma source. Since the photoconductivity of the silicon film formed by one continuous deposition step is low, as described before, it seems that curve C indicates the bonded hydrogen in this film is almost the hydrogen contributory to the structure. In general, the amount of bonded hydrogen is increased as the thickness of the film deposited during one deposition step is increased.

A silicon film containing a large amount of bonded hydrogen was not necessarily obtained even when hydrogen was used as the carrier gas in the step of thin film deposition. Some silicon films deposited even near the hydrogen plasma source were smaller in amount of bonded hydrogen than a silicon film deposited in one continuous step according to the customary thermal CVD method. This is so because the total amount of bonded hydrogen depends on the thickness of a film deposited in one step as described hereinbefore.

Figure 3:
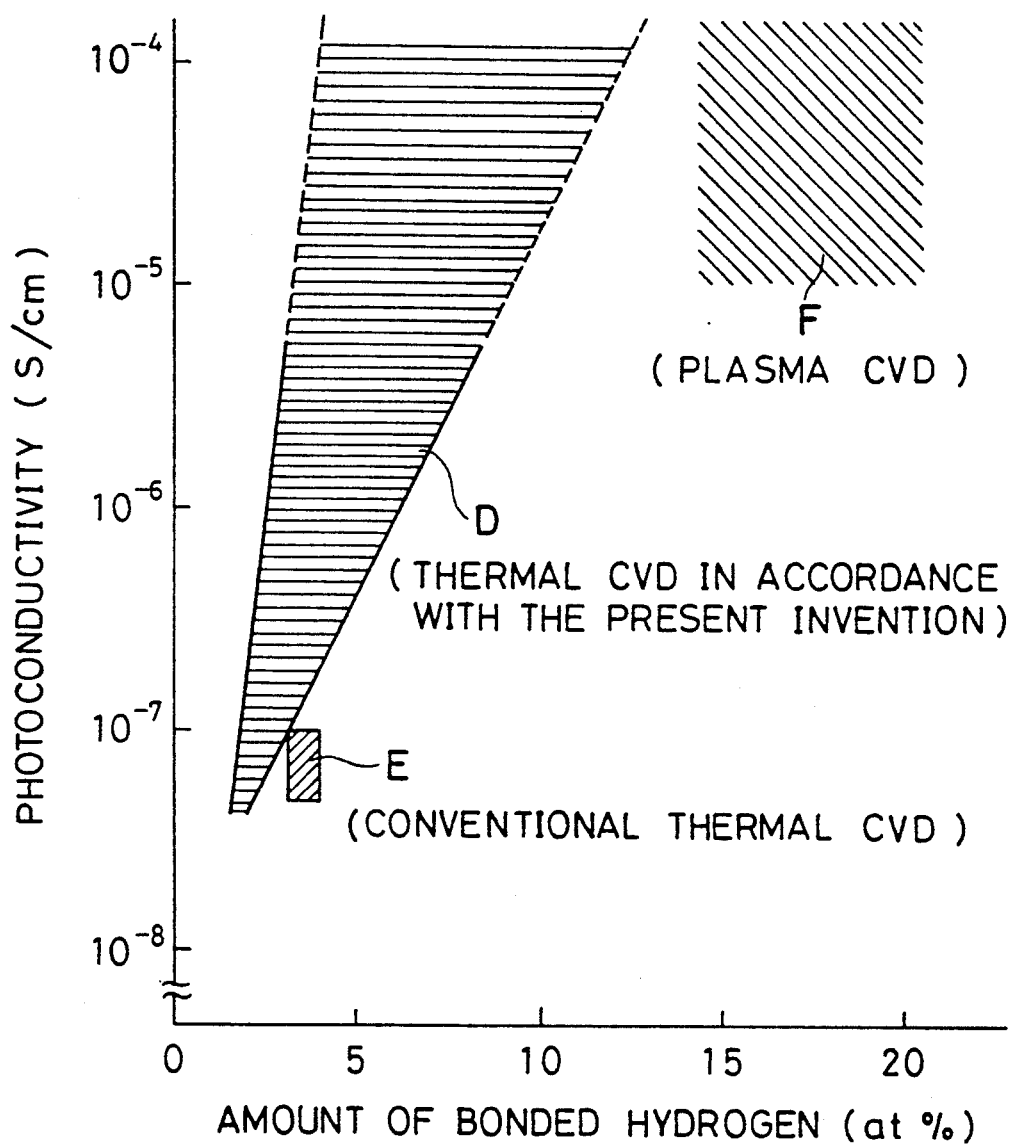
FIG. 3 is a characteristic diagram showing the relationship between the photoconductivity of a thin semiconductor film and the amount of bonded hydrogen contained in the thin semiconductor film.

FIG. 3 shows the relationship between the photoconductivity of the silicon film and the amount of the bonded hydrogen in the silicon film formed in accordance with the present invention (shown as region D) as comparing with those of the film formed by the conventional thermal CVD (shown as region E) and plasma CVD (shown as region F).

In the case of silicon films formed according to the process of the present invention, an improvement in photoconductivity, relative to an increase in the amount of bonded hydrogen, is greater than in the case of silicon films formed according to the conventional thermal CVD and plasma CVD methods, as shown in FIG. 3. More specifically, amorphous silicon films with good properties, deposited by the plasma CVD method, contained 15 to 20 atomic % of bonded hydrogen and had a photoconductivity of $10^{-5}$ to $10^{-4}$ S/cm, while the thermal CVD process of the present invention in this Example has a potential of forming amorphous silicon films respectively having photoconductivities of about $10^{-5}$ S/cm and about $10^{-4}$ S/cm when the amounts of bonded hydrogen contained therein are at levels of 3 to 4 atomic % and 4 to 5 atomic %, respectively. When the present equipment is improved in respect of leak and impurity incorporation to raise the purity of excited hydrogen and increase the concentration of excited hydrogen in gaseous phase, it is believed that a photoconductivity of up to $10^{-4}$ S/cm will be secured as shown by dashed line.

EXAMPLE 2

An experiment was carried out using the equipment as shown in FIG. 1 to examine what should be the thickness of a thin film deposited before feeding thereon to of excited hydrogen in order to effectively improve the photoconductivity thereof. The deposition conditions are as follows:

gaseous starting material and carrier gas as well as flow rates thereof: $Si_2H_6$ 12 sccm + $H_2$ 40 sccm;
substrate and temperature thereof: quartz, 440° C.

After the first deposition step, excited hydrogen from a hydrogen plasma formed by plasma discharge with an AC power of 30 W (13.56 MHz) was fed onto the deposited films at a flow rate of 40 sccm. In this step, the pressure in the quartz chamber was 0.33 Torr.

Figure 4:
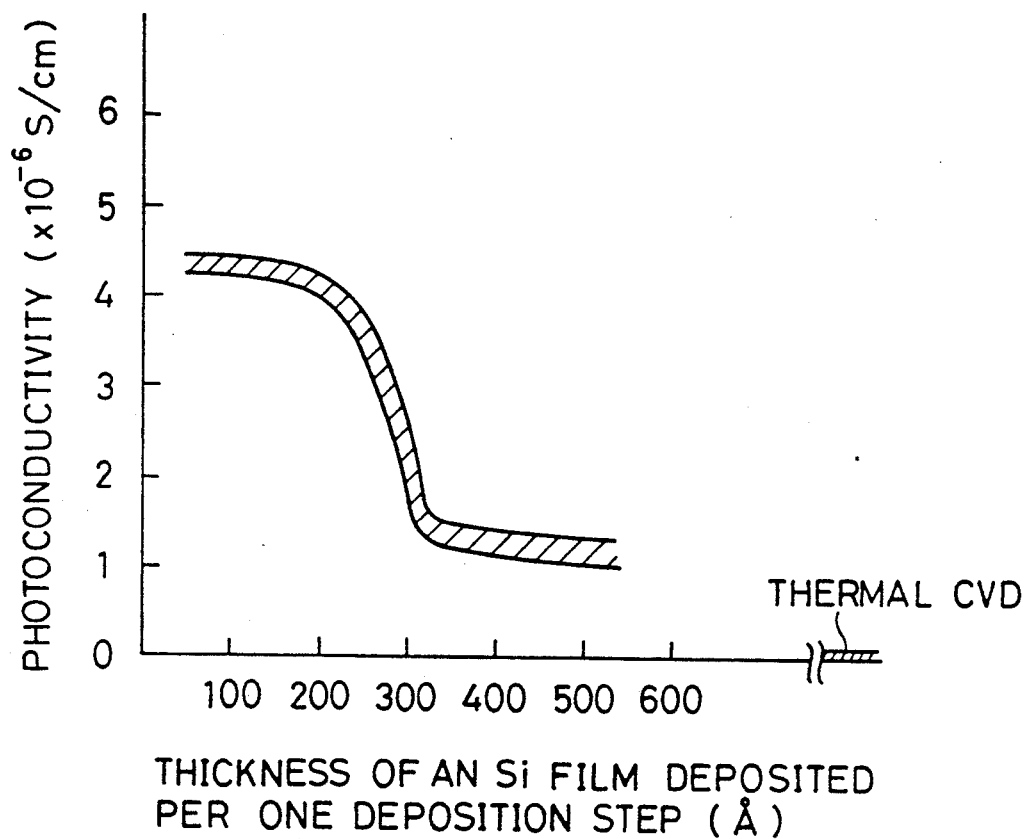
FIG. 4 is a characteristics diagram showing the variation of the photoconductivity of a thin semiconductor film with the silicon film thickness per single deposition operation.

FIG. 4 shows the results of runs wherein thin silicon films having a thickness of 1,500 to 3,000 Å were each deposited by alternately repeating thin film deposition and excited hydrogen feeding a number of times. These results are summarized in the form of a variation of photoconductivity with film thickness per single deposition in FIG. 4. Even when the film thickness per single deposition exceeded 500 Å, the photoconductivity of a film was improved by one figure over that in the case of simple thermal CVD (without excited hydrogen feeding). Thus, it is not indispensable in the present invention to specify the film thickness per single deposition. When the film thickness per single deposition was 300 Å or smaller, however, the photoconductivity was further improved by up to four times as can be seen in FIG. 4.

The results shown in FIG. 4 were obtained using the equipment as shown in FIG. 1 wherein the plasma was formed not right above a deposited thin film without acceleration of excited hydrogen. In this case, therefore, the film thickness per single deposition which is capable of presenting a remarkable effect was restricted on the small side. In the case of hydrogen excitation right above a deposited thin film and/or excited hydrogen acceleration vertical to the thin film, however, the photoconductivity should be remarkably improved through feeding of excited hydrogen even when the film thickness per single deposition is larger than 500 Å.

EXAMPLE 3

A description will be made of another embodiment of the present invention wherein feeding of excited hydrogen onto a substrate is followed by deposition of a thin film. This Example demonstrates an improvement in the deposition rate when the above-mentioned embodiment was experimentally carried out.

The experiment of this Example was carried out using the equipment as shown in FIG. 1. Hydrogen was introduced into the chamber at 40 to 45 sccm to adjust the chamber pressure to about 0.6 Torr. The switch 13 was turned on to apply an AC voltage across the discharge electrodes 12. A hydrogen plasma was formed with an AC power of 40 W. The excited hydrogen was fed onto the substrates 3 and 3' for 5 minutes (at this stage, the substrates had already been heated at 425° C.). Thereafter, $Si_2H_6$ was flowed into the chamber to adjust the chamber pressure to 10 Torr. Thus, $Si_2H_6$ was fed onto the substrates heated at 425° C. with the flow rate of 3 sccm. Thin silicon films were deposited at a rate of 70 to 40 Å/min. Even if the deposition was made three to ten minutes after the excited hydrogen feeding, the deposition rate varied only within the above-mentioned range. However, this deposition rate was 5 to 3 times higher than that of simple conventional thermal CVD experiment using the same equipment without preliminarily feeding excited hydrogen onto substrates. When $Si_2H_6$ as the gaseous starting material and hydrogen gas as the carrier gas were flowed at 12 sccm and 40 sccm, respectively, to deposit thin silicon films at a deposition temperature of 440° C., the deposition rate was improved 1.7- to 2-fold of that of the thermal CVD without the preliminary treatment by the excited hydrogen.

According to the foregoing embodiment of the present invention, a similar improvement in deposition rate is recognized under any varied deposition conditions including the kind and flow rate of carrier gas and the deposition temperature.

After excited hydrogen is preliminarily fed onto a substrate, thin film deposition and excited hydrogen feeding may be alternately repeated as in Examples 1 and 2 to obtain a thin film having a desired thickness. According to the foregoing procedure, a thin silicon film improved in photoelectric characteristics can be formed at a high deposition rate.

While Examples 1 to 3 have been described in reference to a case where disilane ($Si_2H_6$) was used as the gaseous starting material to deposit the thin silicon films, monosilane ($SiH_4$), trisilane ($Si_3H_8$), other silane gases and alkylsilane gases having an alkyl group bonded to a silicon atom can be used as well.

As described hereinbefore, the use of a germane gas ($GeH_4$, $Ge_2H_6$, or the like) or a fluorine-substituted germane gas in the form of a germane having some of the hydrogen atoms thereof substituted with fluorine will suffice for germanium deposition. A fluorine-substituted germane gas in the form of a germane having all of the hydrogen atoms thereof substituted with fluorine may be mixed with a silane gas to deposit a thin silicon containing germanium film.

A mixed gaseous starting material composed of a silane gas, a germane gas, an alkylsilane gas, etc. may be used to deposit a thin film composed of silicon, germanium and carbon mixed together at an arbitrary ratio in substantially the same manner as in the foregoing Examples.

As described hereinbefore, the present invention provides the following effects.

(1) Excited hydrogen is effectively utilized to improve the photoelectric characteristics (photoconductivity) of a thin film.

(2) Since the amount of bonded hydrogen is small, the optical band gap is decreased to about 1.6 eV to make the conversion of a long-wavelength light possible accordingly.

(3) Since the deposition temperature may be 450° C. or lower, a substrate made of a low softening temperature material such as glass or stainless steel can be used.

(4) A thin film formed according to the present invention is just small in photo-induced degradation as a thermal CVD film.

(5) The deposition rate is improved at a deposition temperature even lower than that in the case of the conventional high rate thermal CVD method.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. In a thermal CVD process for depositing a thin semiconductor film, the improvement comprising, in the order recited, the steps of:
   a. depositing a thin film comprised of a semiconductive material and having a thickness which does not exceed about 300 Å on a substrate which is heated by feeding to the surface of the substrate a gaseous starting material selected from the group consisting of silane gases, alkyl silane gases and germanium hydride gases;
   b. stopping the feeding of the gaseous starting material;
   c. feeding excited hydrogen to the thin film without exposing the thin film to ambient air;
   d. stopping the feeding of the excited hydrogen; and
   e. repeating steps (a) through (d) at least once.

2. The process for depositing a thin semiconductor film as claimed in claim 1, wherein the gaseous starting material is a silane gas and wherein the thin film is a thin amorphous silicon film.

3. The process for depositing a thin semiconductor film as claimed in claim 2, wherein the gaseous starting material is fed in step (a) together with non-excited hydrogen gas as a carrier gas.

4. The process for depositing a thin semiconductor film as claimed in claim 1, wherein the gaseous starting material is comprised of at least one alkyl silane and wherein the thin film contains carbon.

5. The process for depositing a thin semiconductor film as claimed in claim 1, wherein the gaseous starting material is a germanium hydride gas and wherein the thin film is a thin germanium film.

6. The process for depositing a thin semiconductor film as claimed in claim 5, wherein the germanium hydride gas is fed together with non-excited hydrogen gas as a carrier gas.

7. The process for depositing a thin semiconductor film as claimed in claim 1, wherein the excited hydrogen of step (c) is supplied from a hydrogen plasma formed by discharge in a reaction chamber in which the substrate is placed.

8. The process for depositing a thin semiconductor film as claimed in claim 1, wherein the excited hydrogen of step (c) is generated by plasma discharge of hydrogen.

9. The process for depositing a thin semiconductor film as claimed in claim 1, wherein the excited hydrogen of step (c) is generated by irradiating ultraviolet light onto hydrogen.

10. The process for depositing a thin semiconductor film as claimed in claim 1, wherein the excited hydrogen of step (c) is generated by irradiating x-rays onto hydrogen.

11. The process for depositing a thin semiconductor film as claimed in claim 1, wherein the excited hydrogen of step (c) is generated by irradiating an electron beam onto hydrogen.

12. The process for depositing a thin semiconductor film as claimed in claim 1, wherein the excited hydrogen of step (c) is generated by mixing excited mercury with hydrogen.

13. The process for depositing a thin semiconductor film as claimed in claim 1, wherein the substrate is heated to a temperature which does not exceed 450° C.

14. The process for depositing a thin semiconductor film as claimed in claim 1, further comprising the steps of feeding excited hydrogen to the substrate before thin film deposition in step (a) and stopping the feeding of the excited hydrogen before thin film deposition in step (a).

15. In a thermal CVD process for depositing a thin semiconductor film, the improvement comprising, in the order recited, the steps of:
   a. feeding excited hydrogen to a substrate which is heated;
   b. stopping said feeding of the excited hydrogen;
   c. depositing a thin film comprised of a semiconductive material and having a thickness which does not exceed about 300 Å on a substrate by feeding to the surface of the heated substrate a gaseous starting material selected from the group consisting of silane gases, alkyl silane gases and germanium hydride gases without exposing the substrate to ambient air;
   d. stopping the feeding of the gaseous starting material; and
   e. repeating steps (a) through (d) at least once.

* * * * *